(12) United States Patent
Bhavsar et al.

(10) Patent No.: US 6,779,142 B1
(45) Date of Patent: Aug. 17, 2004

(54) APPARATUS AND METHOD FOR INTERFACING A HIGH SPEED SCAN-PATH WITH SLOW-SPEED TEST EQUIPMENT

(75) Inventors: Dilip K. Bhavsar, Shrewsbury, MA (US); Steve Lang, Stow, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 681 days.

(21) Appl. No.: 09/653,642

(22) Filed: Aug. 31, 2000

(51) Int. Cl.$^7$ ............................................. G01R 31/28
(52) U.S. Cl. ................................. 714/726; 714/727
(58) Field of Search ......................... 327/211; 714/726, 714/738, 727, 729

(56) References Cited

U.S. PATENT DOCUMENTS

| | | | |
|---|---|---|---|
| 5,173,626 A | * 12/1992 | Kudou et al. ............... | 327/211 |
| 5,261,066 A | 11/1993 | Jouppi et al. ............... | 395/425 |
| 5,317,718 A | 5/1994 | Jouppi ........................ | 395/425 |
| 5,758,183 A | 5/1998 | Scales ........................ | 395/825 |
| 5,761,729 A | 6/1998 | Scales ........................ | 711/148 |
| 5,774,474 A | * 6/1998 | Narayanan et al. ......... | 714/726 |
| 5,787,480 A | 7/1998 | Scales et al. ............... | 711/148 |
| 5,802,585 A | 9/1998 | Scales et al. ............... | 711/154 |
| 5,809,450 A | 9/1998 | Chrysos et al. ............. | 702/186 |
| 5,875,151 A | 2/1999 | Mick .......................... | 365/233 |
| 5,890,201 A | 3/1999 | McLellan et al. ........... | 711/108 |
| 5,893,931 A | 4/1999 | Peng et al. ................. | 711/206 |
| 5,918,250 A | 6/1999 | Hammond .................. | 711/205 |
| 5,918,251 A | 6/1999 | Yamada et al. ............. | 711/207 |
| 5,923,872 A | 7/1999 | Chrysos et al. ............. | 395/591 |
| 5,950,228 A | 9/1999 | Scales et al. ............... | 711/148 |
| 5,964,867 A | 10/1999 | Anderson et al. .......... | 712/219 |
| 5,983,325 A | 11/1999 | Lewchuk .................... | 711/137 |
| 6,000,044 A | 12/1999 | Chrysos et al. ............. | 714/47 |
| 6,070,227 A | 5/2000 | Rokicki ...................... | 711/117 |
| 6,085,300 A | 7/2000 | Sunaga et al. .............. | 711/168 |
| 6,477,674 B1 | * 11/2002 | Bates et al. ................. | 714/738 |

OTHER PUBLICATIONS

*Alpha Architecture Reference Manual*, Third Edition, The Alpha Architecture Committee, 1998 Digital Equipment Corporation (21 p.), in particular pp. 3–1 through 3–15.
*A Logic Design Structure For LSI Testability*, E. B. Eichelberger et al., 1977 IEEE (pp. 462–468).
*Direct RDRAM* ™ *256–288–Mbit (512K×16/18×32s)*, Preliminary Information Document DL0060 Version 1.01 (69 p.).
*Testability Features of AMD–K6* ™ *Microprocessor*, R. S. Fetherston et al., Advanced Micro Devices (8 p.).
*Hardware Fault Containment in Scalable Shared–Memory Multiprocessors*, D. Teodosiu et al., Computer Systems Laboratory, Stanford University (12 p.), 1977.
*Cellular Disco: resource Management using virtual clusters on shared–memory multiprocessors*, K. Govil et al., 1999 ACM 1–58113–140–2/99/0012 (16 p.).

(List continued on next page.)

*Primary Examiner*—David Ton (57) ABSTRACT

A system for scan testing a device under test ("DUT") in which the clock speed of the DUT differs from test equipment. A plurality of scan-flops in the DUT form a scan-wheel, which defines a closed scan path. The Data bits in the scan path are shifted through a scan-wheel controller based on the DUT clock speed, so that a different bit passes through the scan-wheel controller on each clock cycle of the DUT. Test data is only loaded by replacing the data bit as it passes through the controller. The different clock rates of the DUT and the test equipment define a scan wheel ratio, which is used to determine the number of times that the scan-wheel must rotate before all old data bits are unloaded and replaced by newly loaded bits, and which also determines when data bits passing through the controller will be unloaded and replaced.

53 Claims, 4 Drawing Sheets

OTHER PUBLICATIONS

*Are Your PLDs Metastable?*, Cypress Semiconductor Corporation, Mar. 6, 1997 (19 p.).

*Rambus® RIMM ™ Module (with 128/144Mb RDRAMs)*, Preliminary Information, Document DL0084 Version 1.1 (12 p.).

*Direct Rambus ™ RIMM ™ Module Specification Version 1.0*, Rambus Inc., SL–0006–100 (32 p.), 2000.

*End–To–End Fault Containment In Scalable SharedMemory Multiprocessors*, D. Teodosiu, Jul. 2000 (148 p.).

* cited by examiner

APPARATUS AND METHOD FOR INTERFACING A HIGH SPEED SCAN-PATH WITH SLOW-SPEED TEST EQUIPMENT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to a system and method for testing electronic devices for operability. More particularly, the present invention relates to a system for performing testing of integrated circuits at full clock speed, using test equipment that operates at a speed slower than the full clock speed of the circuitry being tested.

2. Background of the Invention

The development of integrated circuits has become increasingly complex, due in large part to the ever increasing functionality offered by newly developed circuitry. Integrated circuits are constantly surpassing milestones in development, as more and more finctionality is packaged into smaller sizes. This enhanced functionality and the greater number of transistors packaged in an integrated circuit requires more rigorous testing requirements to insure reliability once the device is commercialized. Thus, new integrated circuit designs are repeatedly tested and debugged during the development process to minimize the number and severity of errors that may subsequently arise. Regardless of the rigor of the developmental testing, invariably a certain percentage of manufactured devices will fail prematurely. To prevent such devices from being sold or used in systems, typically some level of testing is performed on manufactured chips to identify those that may fail prematurely.

A number of different types of testing have been used to minimize the possibility of premature failure of manufactured chips. One of the more popular types of testing is Scan testing. Scan testing is a well recognized design-for-test ("DFT") technique used for addressing certain testing problems in very large scale integrated ("VLSI") circuits. See Eichelberger, et al., "A Logic Design Structure for LSI Testability," (IEEE 1977). A full scan design technique transforms a given sequential circuit into a combinational circuit and shift register (referred to as a scan register) for the purpose of testing. This transformation makes it possible to obtain almost complete fault coverage using an Automatic Test Pattern Generation ("ATPG") program. Typically, as part of the Scan test, large circuits are partitioned into smaller combinational circuits to facilitate fault isolation and failure analysis.

Figure 1:
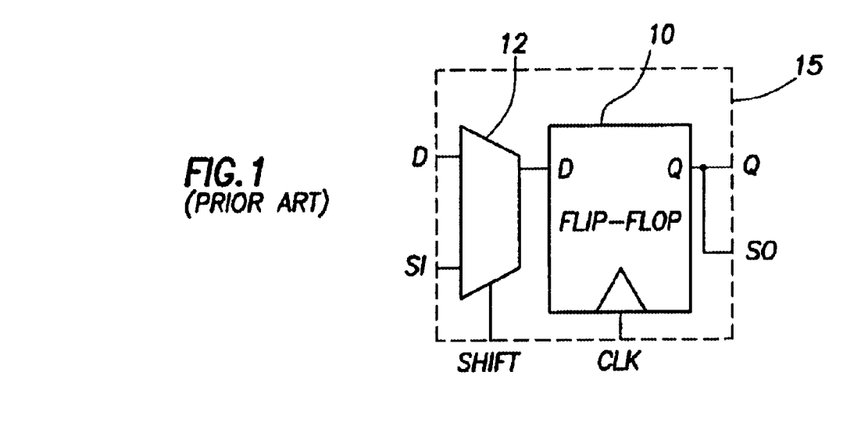
FIG. 1 shows a prior art scan-flop.

The scan design technique implements all or most of the state elements in the device under test, such as flip-flops and latches, as scannable flip-flops, which often are referred to as scan-flops. As shown in FIG. 1, a scan-flop 15 simply comprises a standard flip-flop 10 (that forms part of the circuit being tested) and an additional multiplexer 12 used for scan testing. Two inputs are provided to the multiplexer 12, a D (data) input, and an SI (serial input). The multiplexer selects the D or SI input to pass to the flip-flop 10, based on the status of the SHIFT (or ScanShift) signal. Thus, for example, if the ScanShift signal is asserted, the SI input passes to the D input of flip-flop 10, producing a Q output signal and SO (Serial Out) output signal. Conversely, if ScanShift is de-asserted, the D input passes to the D input of flip-flop 10, producing the Q output signal and the Serial Out signal. The flip-flop 10 is clocked by a clock signal ("CLK"). The use of the SI, SO and ScanShift signal permits the test equipment to perform tests on the flip-flop 10 and other circuitry connected to the flip-flop, such as other combinational logic.

Figure 2:
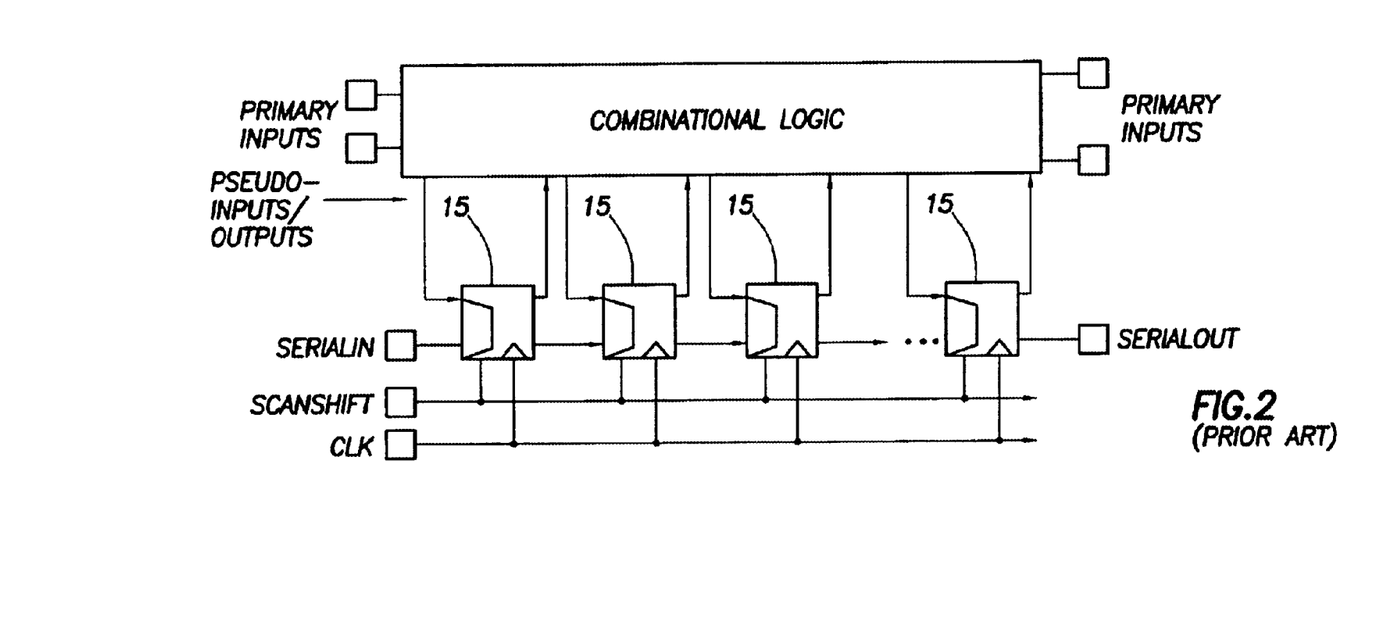
FIG. 2 is a schematic block diagram of a conventional scan register.

An example of a device level scan register, or scan-path, appears in FIG. 2. The scan-path includes a plurality of scan-flops 15 cascaded or chained together, all of which receive a CLK signal and the ScanShift signal. Each of the flip-flops receives a Serial In signal that cascades through the flip-flops to produce a Serial Out signal. In addition, each scan-flop 15 receives a pseudo-output from combinational logic, and produces a pseudo-input that is coupled to the combinational logic. The combinational logic also receives primary inputs and produces primary outputs.

A tester or test controller loads/unloads the internal states on the scan-path directly via the scan interface formed by the two data pins, Serial In and Serial Out, and a control terminal, the ScanShift signal. An ATPG program can treat the state elements as pseudo inputs and outputs of the device. During testing, the scan-path itself is first tested by shifting a simple sequence of 1s and 0s through the chained scan-flops. The ATPG program then generates test vectors that are applied to test the combinational logic, as shown, for example, in the timing diagram of FIG. 3. The input values assigned to the pseudo-inputs in a test vector are serially loaded into the state elements via the scan-path, while those assigned to primary input pins are directly applied to those pins. The device then returns to normal operational mode, typically for one clock cycle, to capture the response of the combinational circuit in the scan-flops. The captured response is unloaded via the scan-path and, at the same time, the state element values corresponding to the next test vector are loaded. This testing sequence repeats until all test vectors are applied.

The scan-flop shown in FIGS. 1 and 2 are often called Data-Mux type scan-flops. In this type of scan-flop, both the normal operation and the scan shift operation use a common clock, thus only requiring a single global clock to be distributed throughout the device under test ("DUT"). In addition, the ScanShift control signal must be routed throughout the chip being tested. Some scan tests require that the scan operation be performed at the full clock speed of the integrated circuit. Thus, if the device under test is a processor operating at 1 GHz to identify certain operational errors, the scan test must be performed at 1 GHz. Because the Data-Mux type scan-flops run at the internal clock speed, the scan-path comprising the Data-Mux type scan-flops can be easily designed to operate at the full clock speed. Problems arise, however, when interfacing the high speed scan-path with the external test equipment, which must match the high rate of data transfer through the scan-path. This significantly increases the complexity and cost of the test equipment, as well as the fixtures and accessories required for testing.

Figure 4:
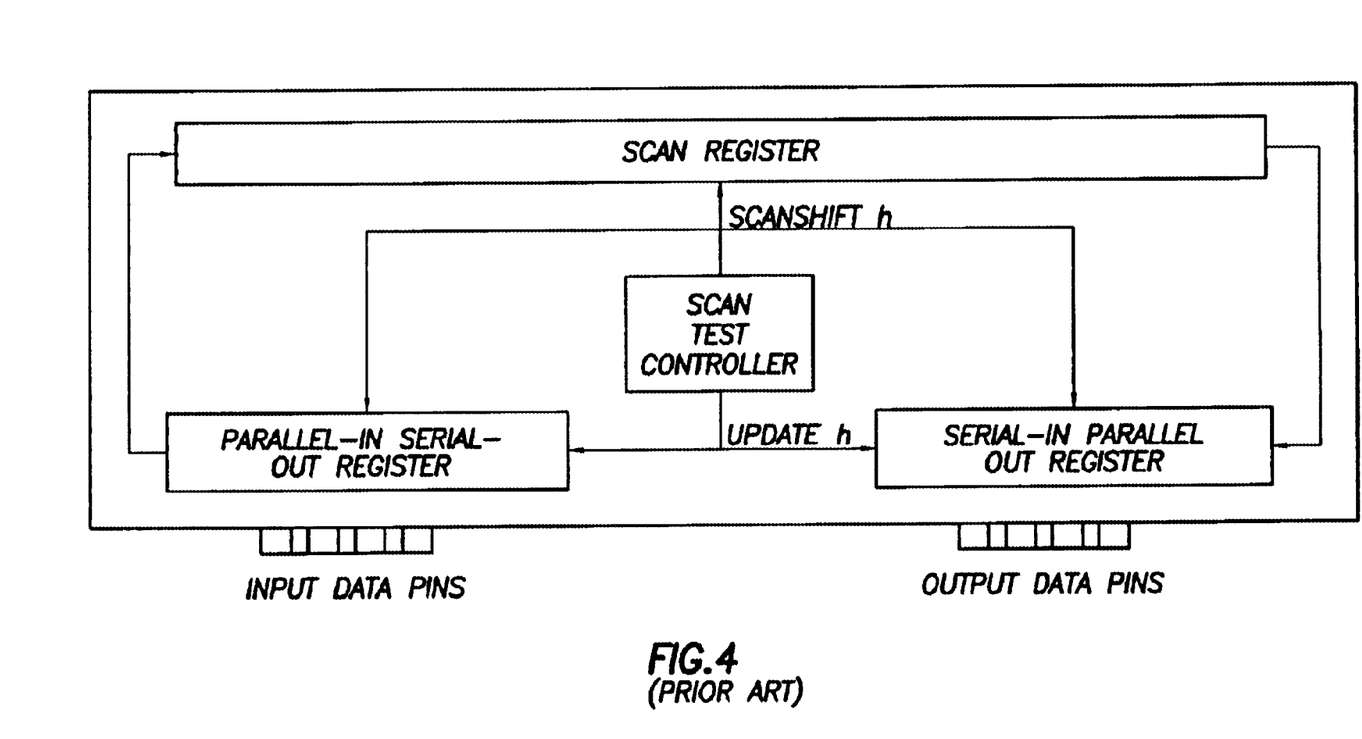
FIG. 4 illustrates a prior art serial-parallel interface for coupling together slow speed test equipment with a high speed device under test.

One common solution to this problem is shown in FIG. 4, in which parallel-in/serial-out ("PISO") registers are used to convert parallel input data to serial data, and conversely, serial-in/parallel-out ("SIPO") registers are used to convert the serial output of the scan register to a parallel output. The PISO registers and SIPO registers therefore are used to throttle input signals from a slower test device to a higher speed device under test, and to throttle down test results from the device under test to the test device. Thus, for example, a 1 GHz device under test may receive 10 parallel input signals from a 100 MHz tester. The 10 input signals, received at 100 MHz, are received in the PISO and converted to 1GHz serial signals to be successively applied to a serial input terminal of the device under test. The 1 GHz signals on the serial output pin are converted to 10 parallel signals in the SIPO register, where the signals are clocked out at 100 MHz. The main problem with this technique is that it requires many input and output terminals on the device under test to implement. In the example above, 10 input pins and 10 output pins are required to effectively provide a single serial input and a single serial output for testing. Needless to say, the overhead associated with configuring a device under test to accept this number of test pins can be prohibitive.

It would be advantageous if a technique could be developed for testing high speed electronic circuits with slower speed test equipment, without requiring a large number of terminals on the device under test to be used for interfacing with the slower speed test equipment. It would also be advantageous if the slower speed test equipment could be used to perform full speed testing of the device under test. Despite the apparent advantages of such a system to date no such system has been developed.

BRIEF SUMMARY OF THE INVENTION

The present invention solves the deficiencies of the prior art by configuring a scan-path as a closed loop scan-wheel. The ratio between the operating speed of the device under test (and thus the scan-flops in the scan-path), and the operating speed of the test equipment defines a scan wheel ratio (referred to as the SwRatio). The SwRatio defines the DUT clock cycles when test data can be loaded into and unloaded from the scan-wheel, and also indicates the number of times that the scan-wheel must be rotated to load all test data into the scan-flops. According to the preferred embodiment, one bit of the scan-wheel data is read and replaced on each clock cycle of the test equipment, using a single pair of serial input ("Serial In") and serial output ("Serial Out") pins. The scan wheel rotates one bit position for each clock cycle of the device under test ("DUT"), so that a different bit of scan-wheel data visits the Scan Wheel Controller on each clock of the DUT. The Scan Wheel Controller, however, only loads and unloads data based on the clock cycle of the test equipment.

After the scan-wheel rotates SwRatio times, one complete set of test data will have been loaded on all scan-flops in the scan-path. At that time, the Scan Wheel Controller asserts a control signal (by de-asserting ScanShift), which causes all scan-flops to capture data from the combinational circuit. This data is the response calculated from the data present in the scan-flops at the beginning of the cycle. On the next clock cycle, the ScanShift signal is re-asserted to resume subsequent loading and unloading of test data by the Scan Wheel controller.

According to the preferred embodiment, the Scan Wheel Controller includes a Scan Length Parity Control Flop that may be added to the scan-path to result in an odd number of scan-flops in the scan-wheel, thus insuring that a different set of scan-flops visit the Scan Wheel Controller during each rotation of a loading/unloading cycle. The Scan Wheel Controller includes a data path and control logic that operate in conjunction to load and unload data from each scan-flop during the Load/Unload cycle, and to capture data during the Capture cycle.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. The term "device under test" or "DUT" refers to an integrated circuit or other electronic component that has been assembled or manufactured and is the subject of a functionality test. The term "scan-flop" refers to a flip-flop or other logic device that has been incorporated in a device under test. The term "scan-path" refers to a series of scan-flops that have been coupled together for testing purposes. To the extent that any term is not specially defined in this specification, the intent is that the term is to be given its plain and ordinary meaning.

DETAILED DESCRIPTION OF THE PREFERRED EMBODIMENTS

Figure 5:
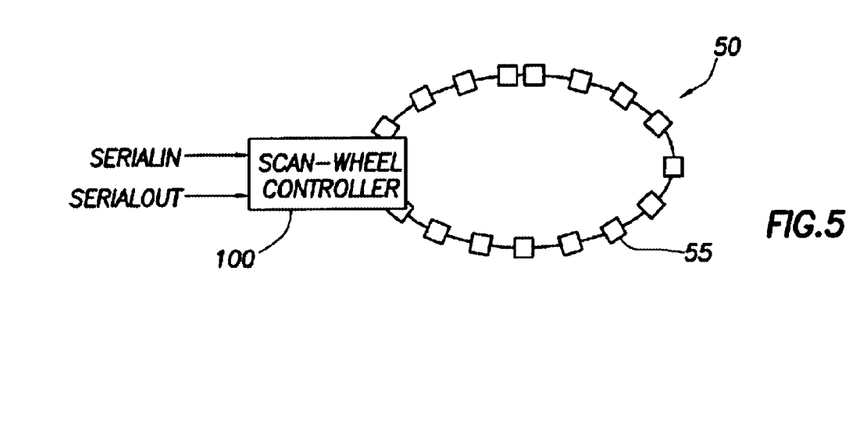
FIG. 5 is a block diagram of a Scan-Wheel constructed in accordance with the preferred embodiment.

The present invention modifies the conventional scan-path as shown for example in FIG. 2 by closing the scan-path into a scan-wheel. As shown in FIG. 5, a scan wheel 50 preferably comprises a closed loop scan-path, with the last scan-flop providing a Serial Out signal that couples to a Serial In input terminal of the first scan-flop. Thus, each of the blocks 55 in the scan wheel 50 represents a scan-flop in a closed scan-path. According to the preferred embodiment, the scan wheel 50 preferably comprises an odd number of scan-flops in the closed scan-path, although this is not an absolute requirement, as explained in more detail below. The operation of the scan-wheel can be understood by imagining "buckets" that move around the closed scan-path. At any given time, one bucket resides at each scan-flop. The number of buckets is therefore equal to the number of scan-flops in the scan-path. Each bucket contains a bit of data which is equal to the content of the scan-flop at which it resides. Each time the data in the scan-flops is shifted one position along the scan-path via the serial inputs and outputs of the scan-flops, the buckets are imagined to move one position as well carrying the data with them. Each time the scan-flops are loaded with data from the combinational circuit coupled to the scan-path, the buckets are imagined to remain stationary while their content is replaced with the data from the combinational circuit.

The scan wheel 50 may be constructed as a circular shift register path formed by scan-flops, such that the total number of scan-flops in the path is an odd number. Thus, each "bit" in the circular shift register represents the input or output of a scan-flop. If desired, multiple scan-wheels may be used in parallel to permit multiple test data bits to be loaded to multiple test pins.

In addition to the scan wheel, and referring still to FIG. 5, the preferred architecture preferably includes a scan wheel controller 100. Each time the data in the scan-flops is shifted one position along the scan-path via the serial inputs and outputs of the scan-flops, the scan wheel controller 100 can sample the data bit shifted out of the last scan-flop and replace it with new data to be shifted into the first scan-flop. When this happens, the content of the bucket that moves from the last scan-flop to the first is imagined to be modified as it passes through the controller such that the new content of the bucket is equal to the data bit loaded into the first scan-flop. Moreover, the data bit sampled by the controller from the last scan-flop is, by definition, equal to the envisioned content of the bucket before its content was modified. During the loading and unloading of test data, the scan wheel controller 100 conceptually "rotates" a predetermined number of times, which can be represented by the variable, SwRatio. During the load/unload cycle, when test data is loaded and unloaded from each bucket in the scan-wheel 50, the scan wheel controller 100 shifts the scan-wheel by one position for each clock cycle of the device under test ("DUT"), so that a different bucket visits (or is examined by) the scan wheel controller 100 on every clock cycle of the DUT. When the clock cycle of the device under test and the test equipment coincide, the scan wheel controller 100 will load and unload data from the bucket that is "visiting" (or which is being viewed) at that point in time. The scan wheel 50 completes one rotation when the first bucket in the scan-path re-visits the scan wheel controller 100. As the scan wheel 50 makes a new rotation, a different set of buckets is loaded and unloaded on each clock cycle of the test equipment. When the scan wheel 50 completes SwRatio rotations, all of the buckets will have been loaded and unloaded with data. This procedure is referred to herein as the load/unload cycle.

It should be understood that although the present invention refers to rotating the scan-wheel, and having buckets visit the scan-wheel controller, that no physical motion occurs. The rotation and visiting referred to herein is intended to conceptually convey to the reader the principles of the present invention. In actuality, the scan-wheel controller physically connects to the output terminal of the last scan-flop, and the input terminal of the first scan-flop. In addition, the scan-wheel controller connects via a control signal (ScanShift) to each scan-flop. The scan-flop bits are shifted or rotated by having the scan-wheel controller load test data into the first scan-flop. The wheel is "rotated" by the assertion of a control signal by the scan-wheel controller, and the internal clock of the DUT, which together cause the input test bit to propagate through the subsequent scan-flop on the next clock signal of the DUT. This shifting of the test bit continues on each subsequent clock of the DUT. The next test bit is loaded on the next clock cycle of the test equipment (which typically is different than the clock cycle of the DUT), and this test bit also propagates through to each subsequent scan-flop on successive clock cycles of the DUT. The unloading of test result bits occurs in the same way. After a test result is captured, it can be shifted on successive clock cycles of the DUT to the scan-wheel controller, where it can then be unloaded. Thus, it should be understood that the concept of a rotating wheel and a visiting bucket is for purposes of illustrating the invention, and is not intended to connote a physical movement of the circuit elements that form part of the present invention.

The variable SwRatio, which defines the scan wheel ratio between the DUT clock speed m and the test equipment clock speed, may be represented as follows:

$$SwRatio = \frac{\text{Clock rate at which scan path shifts data}}{\text{Rate at which data is exchanged with test equip.}}$$

Thus, if the internal clock rate of the device under test (in which the scan-flops are incorporated) is 800 MHz, and the tester operates (clock data) at 100 MHz, the SwRatio=8. In the preferred embodiment, the SwRatio is an integer in the form of $2^n$, with $n \geq 0$. It should be understood, however, that various SwRatio values may be used, as long as the SwRatio and the total number of scan-flops in the scan-wheel do not share common prime number factors. Any SwRatio can be accommodated, therefore, by adding a suitable number of extra or dummy scan-flops to satisfy this condition.

In accordance with the preferred embodiment, the scan wheel 50 conceptually rotates at its internal clock speed. The scan wheel controller 100 preferably samples a bucket periodically, as determined by the scan wheel ratio, SwRatio. Thus, if the SwRatio ratio is 8, the scan wheel controller 100 will unload and load a bucket every 8 cycles of the DUT internal clock. Continuing with this example, the scan wheel controller 100 continues rotating the scan wheel eight times. Because the number of buckets preferably is odd, by rotating the scan wheel eight times, all of the buckets in the scan-path will be serviced (loaded/unloaded) by the scan wheel controller 100.

Thus, as a further example, if a device under test was a processor operating at 1 GHz (1,024 MHz), and the test equipment operated at 4 MHz, the SwRatio would be calculated as 256 pursuant to the equation above. This means that for every 256 cycles of the internal clock of the processor, the tester will load/unload data from a single bucket. Thus, according to the preferred embodiment, every 256 cycles of the processor clock, the tester will load one bit of data in one bucket in the scan wheel and will unload a one bit test result from that same bucket. As the scan wheel rotates, the controller loads and unloads the visiting buckets at a regular interval determined by SwRatio. The odd number of buckets in the scan wheel ensures that in each rotation a different set of visiting buckets gets serviced. The rotation of the scan wheel ensures that the buckets preserve their respective states until each bucket is unloaded and loaded.

The SwRatio therefore defines the ratio between the internal clock speed of the device under test and the tester, and also determines the number of cycles required to load a bit in each of the buckets in the scan wheel. As an example, if the scan wheel includes 33 buckets, and the SwRatio is 8, then the tester will unload and load a bit every 8 clock cycles of the device under test, and the scan wheel controller will conduct 8 cycles to unload/load a bit in each bucket. On the first rotation of the scan wheel, the scan-wheel controller will unload and load a bit in buckets 1, 9, 17, 25 and 33. On the next rotation, the scan wheel controller will unload and load a bit in buckets 8, 16, 24 and 32. The third rotation will result in buckets 7, 15, 23 and 31 being unloaded and loaded. This will continue until 8 rotations are performed, causing each bucket to be unloaded and loaded. During the unloading and loading, the ScanShift signal is asserted, causing the scan-flops to capture the test bit presented on the Serial In terminal. Once the 8 rotations are complete and all test bits have been loaded on the Serial In terminals of the scan-flops (while previous test results are unloaded), the ScanShift signal is de-asserted, causing the scan-flops to ignore the Serial In and Serial Out terminals, and thus capture the test data from the combinational circuit. This period is referred to herein as the capture cycle. Subsequently, the Serial Out data is collected or unloaded from each bucket during the next loading/unloading cycle, and new test data is provided as an input to each bucket (the loading).

Figure 3:
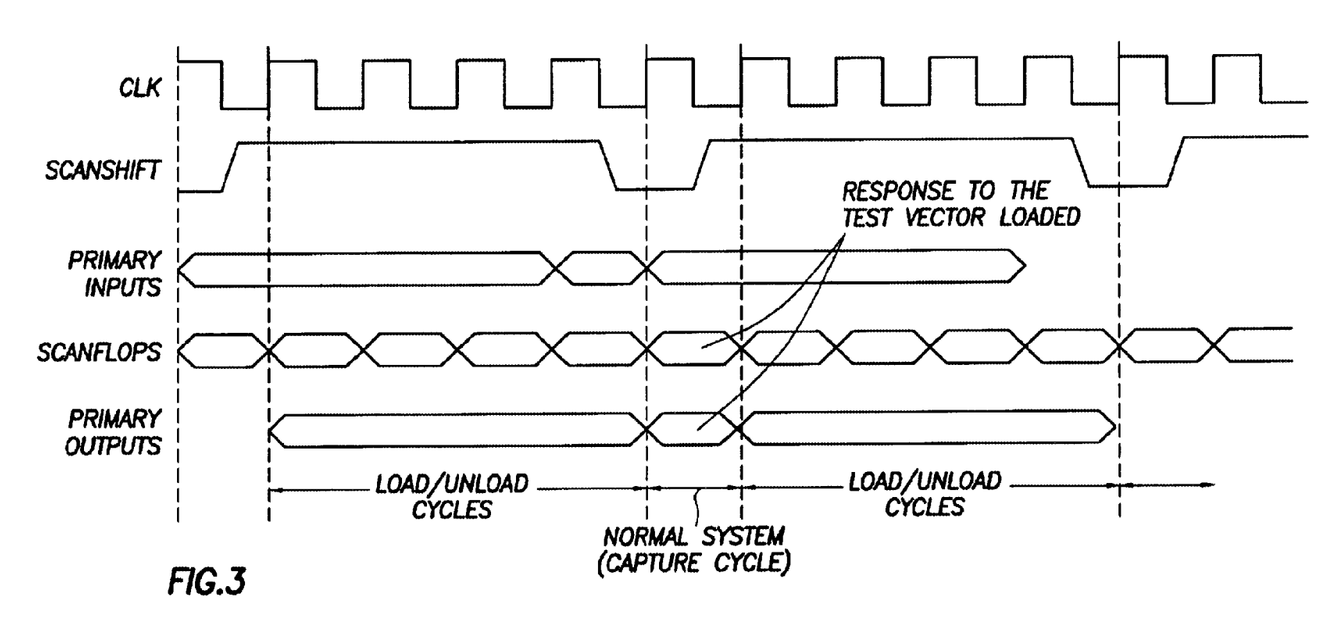
FIG. 3 depicts a timing diagram for the scan register of FIG. 2.

In the preferred embodiment, data is simultaneously unloaded and loaded at each bucket when the bucket visits the scan wheel controller 100. Thus, the test process constructed in accordance with the preferred embodiment implements essentially the same timing diagram that is illustrated in FIG. 3. A first test pattern is shifted into each bucket by rotating the scan wheel SwRatio times. During the next DUT clock cycle, the test pattern is fed into the combinational circuit through the scan-flops, and is captured by the scan-flops at the end of the cycle by de-asserting the ScanShift control signal. This gives the combinational circuit one DUT clock cycle to respond to the data. The scan wheel is again rotated, and the previous test results are unloaded from each bucket and a new test bit is loaded. This enables the scan-flops to be tested at full clock speed, while the test equipment operates at its slower clock speed. Because the device under test is tested at its full clock speed when the test response is captured, the combination al logic can be tested to determine if it is making calculations within the requisite time period of one clock cycle, without any delay faults.

Figure 6:
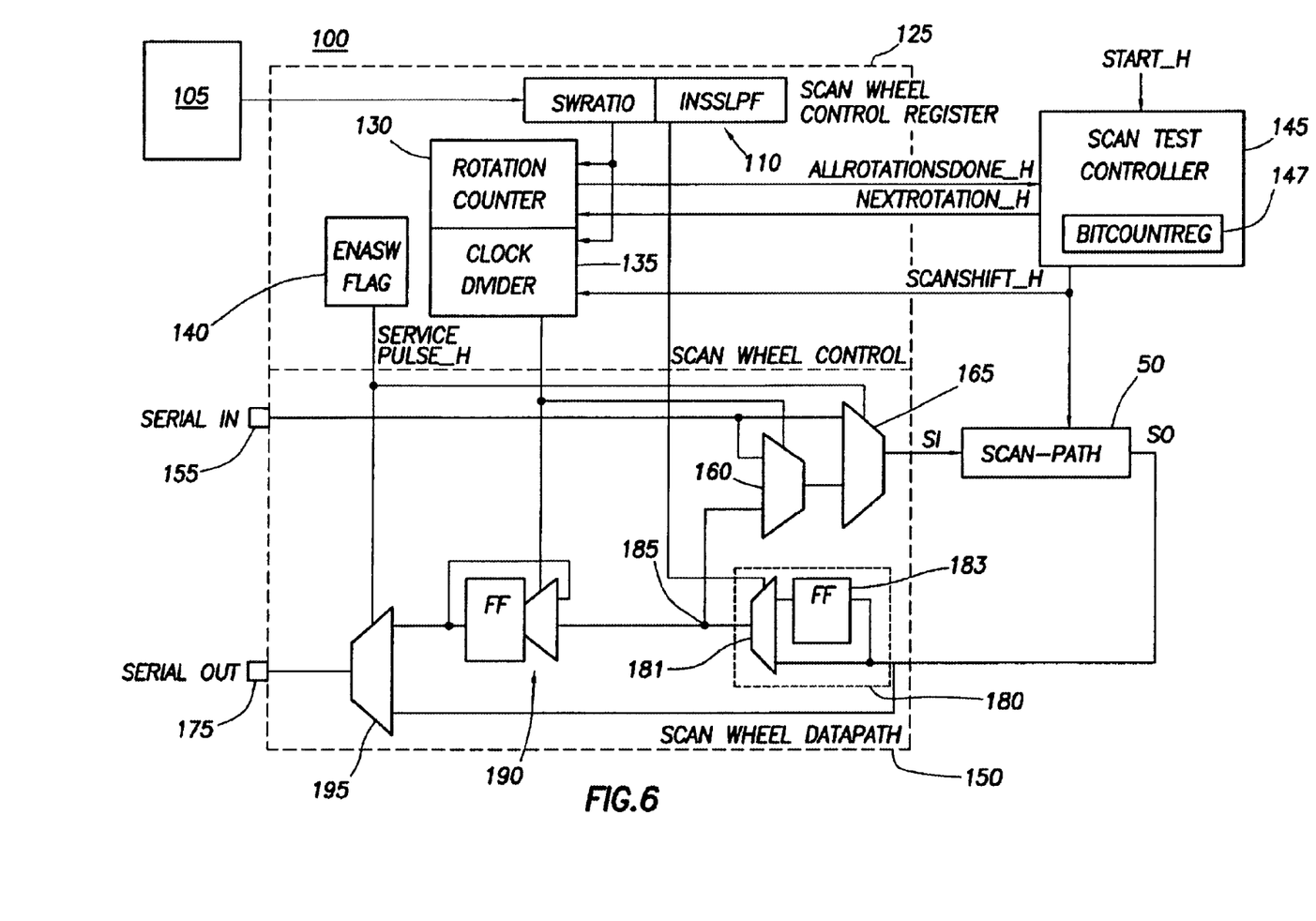
FIG. 6 is a schematic block diagram depicting the Scan Wheel Controller of FIG. 5.

Although FIG. 6 depicts the Serial In and Serial Out as separate pins, it should be understood that the input and output terminals may be integrated into a single pin. One way to implement a single terminal would be to time multiplex the data coming in with the data coming out on a single pin.

The present application also can be used to inspect the state of scan-flops (or state elements) in the event that an error occurs during normal system operation. To do this, the ScanShift signal is asserted, causing the state of the scan-flops to be shifted out on the Serial Out terminal, from where it can be stored in the system memory and subsequently retrieved and processed. It should further be noted that at any time the state of the system can be retained, if desired, by not loading additional data into the scan-wheel.

Referring now to FIG. 6, the scan wheel controller 100 preferably includes a control logic section 125, a data path section 150, and a scan-test controller 145. The data path 150 includes a Serial In terminal 155, a Write multiplexer 160, a Scan-path side multiplexer 165, the Scan-path 50, Scan-Length Parity Control flop 180, a Sample Point 185, a Sampler Flop 190, a Pin-side multiplexer 195, and a Serial Out terminal 175. The test equipment loads input test data on the Serial In terminal, and test results are provided as an output on the Serial Out terminal 175.

The Scan-Wheel Controller 100 applies the Serial In test signal to the first scan-flop in the Scan-Path 50 when updating the content of the visiting bucket under control of the Write Multiplexer 160 and the Scan-path side multiplexer 165. The Write multiplexer 160 connects electrically to the Serial In terminal 155 to receive the Serial In data signal as an input from the test equipment. The Write multiplexer 160 also connects electrically to Sample Point 185, which it receives as a second input. The Write multiplexer 160 receives a control signal (ServicePulse_h) from the control section 125 (namely, from the Clock Divider 135) that determines which input signal to pass as an output signal. The Write Multiplexer 160 either injects a new value fed at the Serial In terminal 155 into the scan-path, or else it re-circulates the old value, based on the value of ServicePulse_h. The output terminal of Write multiplexer 160 connects to the input terminal of the Scan-path side multiplexer 165. The signal controlling operation of the Scan-path side multiplexer 165 comprises a control signal received from the EnaSW Flag 140 in control section 125. The Scan-path side multiplexer 165 passes the Serial In ("Si") signal directly to the scan-path when the EnaSW Flag is set.

The content of the bucket visiting from scan-path 50 appears as the Serial Out ("So") signal that represents the output response bit captured when the ScanShift signal ("ScanShift_h") is de-asserted. The Serial Out signal is applied to a Scan-length parity control flop 180 that closes the scan path back on the Write multiplexer 160 at the Sample Point 185. The Scan length parity control flop 180 comprises a flip-flop 183 and multiplexer 181 that finctions as a dummy scan-flop that can be added to the scan-path to provide an odd number of scan flops in the scan-wheel, if necessary. The Sampler Flop 190 captures data at the Sample Point whenever ServicePulse_h is asserted by the Clock Divider 135, and feeds the Serial Out terminal 175 via the Pin-side multiplexer 195. The Pin-side multiplexer 195 receives a control signal from the EnaSW Flag 140 that selects the Serial Out terminal 175 or the standard data output pin of the last scan-flop in the scan-path.

The control section 125 preferably includes a Scan-wheel control register 110, a rotation counter 130, a clock divider 135, and the enable scan wheel ("EnaSW") flag 140. The Scan-wheel control register 110 preferably includes two fields—SwRatio and InsSLPF. The Scan-wheel register 140 is loaded by a suitable test control program 105. According to one exemplary embodiment, the Scan-wheel control register 110 is loaded via an IEEE 1149.1 TAP (Test Access Port). The SWRatio field holds the SwRatio value. Thus, the SwRatio field controls the number of times the scan-wheel is rotated, and the intervals between which the visiting buckets are read (unloaded) and written (loaded) via the Serial In and Serial Out terminals. The InsSLPF field preferably comprises a single bit that indicates whether to insert a dummy scan-flop in the scan-path to make the total number of scan-flops in the scan-path an odd number.

The Rotation Counter 130 counts the number of rotations during an unload/load cycle, and produces an AllRotationsDone_h signal when all the rotations have completed for a load/unload cycle. The Clock Divider 135 preferably comprises a counter that counts the number of scan-flops shifted through the scan-wheel and provides a pulse (ServicePulse_h) every SwRatio shift cycle. Thus, if the SwRatio was 8, the Clock Divider 135 would produce a ServicePulse_h on every $8^{th}$ clock cycle of the DUT to the Write multiplexer 160 and Sampler flop 190. The EnaSW flag 140 determines if the scan-path is accessed directly from the serial data pins (standard test mode), or via the scan-wheel (scan-wheel test mode). The EnaSW flag is set at the start of any scan test operation that requires the use of the scan-wheel mechanism, and provides a control signal to the Scan-path side multiplexer 165 and the Pin-side multiplexer 195.

The Scan Test Controller 145 includes a BitCount register 147 that is loaded with a value representing the number of scan-flops in the scan-path. The Scan Test Controller 145 is initialized with a Start_h signal from the test program, and produces the ScanShift_h signal to all scan-flops in the Scan-path 50, and to the Clock Divider 135.

Operation of the scan-wheel begins with the loading of the two control registers, which are the Scan-Wheel control register 110 and the BitCount register 147 in the Scan Test Controller 145. The user sets the InsSLPF bit to insert the dummy scan-flop if necessary to make an odd number of scan-flops in the overall scan-path. The test command initiating use of the scan-wheel mechanism sets the EnaSW Flag. This switches the Pin-side multiplexer 195 and the Scan-path side multiplexer 165 to enable the scan-path unload/load operations via the Serial In and Serial Out terminals, instead of the standard data pins.

Upon the assertion of Start_h, the Scan Test Controller 145 begins sequencing the Unload/Load and Capture cycles. The Scan Test Controller 145 preferably asserts the ScanShift_h signal during the Unload/Load cycles. The scan-wheel controller 100 shifts the scan-path by one bit position for every clock cycle of the DUT. While ScanShift_h is asserted, the Clock Divider counter 135 increments. The Clock Divider 135 preferably comprises a modulo-SwRatio counter. As the counter overflows (which occurs on the count value equal to the value of SwRatio), the Clock Divider 135 asserts ServicePulse_h for one clock cycle of the DUT. The Sampler Flop 190 uses the ServicePulse_h signal to read the scan-flop bit currently at the Sample Point 185, and then holds that value at the Serial Out terminal. The Write multiplexer 160 also uses the ServicePulse_h signal to inject a new test value into the scan-flop bit being serviced. After shifting for a number of cycles determined by the value in the BitCount register 147 (which represents the number of scan-flops in the scan-path), the Scan Test Controller 145 asserts the NextRotation_h signal to the Rotation Counter 130, thereby indicating completion of one scan-wheel rotation. The pulse on NextRotation_h increments the Rotation Counter 130. When the scan-wheel has completed SwRatio rotations, the Rotation Counter 135 asserts AllRotationsDone_h, which signals the Scan Test Controller 145 to exit the Unload/Load cycle, and proceed to perform the Capture cycle by de-asserting ScanShift_h for one clock cycle of the DUT.

The above discussion is meant to be illustrative of the principles and various embodiments of the present invention. Numerous variations and modifications will become apparent to those skilled in the art once the above disclosure is fully appreciated. For example, an additional control bit may be added to the scan control register 110. This control bit (which may be called "SuppressLoad") can be set by the user of the scan-wheel to block the ServicePulse_h signal to the Write-multiplexer 160. Thus during scan-wheel operation, the old data is simply recirculated and no new data is loaded in the scan-wheel. This feature automatically restores the internal state once the unload is complete. As another variation, and as mentioned above, multiple scan-wheels may be used simultaneously to load and unload test bits or data in parallel. Another variation is that the circuitry tested by the scan-wheel may be combinational, or may be any arbitrary sequential circuit. Thus, the present invention is not intended to be limited to the testing of any particular circuit arrangement. In addition, in the discussion above, it was noted that the capture cycle is implemented in one clock cycle of the DUT. It should be noted that the capture cycle may be completed in multiple cycles of the DUT if necessary, or if required by the configuration of the device being tested. Furthermore, it should be understood that the present invention may be implemented in a DUT, without requiring that every flip-flop in the DUT be included in the scan-path. It is intended that the following claims be interpreted to embrace all such variations and modifications.

What is claimed is:

1. A method of scan testing an electronic device with test equipment that operates at a slower clock speed than the electronic device, comprising the acts of:
    forming a scan wheel that includes a plurality of scan-flops in a closed scan-path;
    determining a ratio between the clock speed of the electronic device being tested and the clock speed of the test equipment;
    shifting a bit of scan-path data past a scan wheel controller on clock cycles of the electronic device;
    replacing the data bits passing through the scan-wheel controller on clock cycles of the test equipment; and
    performing an at speed test of the electronic device once test data has been loaded in each scan flop in the scan wheel.

2. The method of claim 1, further comprising the act of unloading test data from each scan-flop subsequent to the at speed test.

3. The method of claim 2, wherein the act of loading test data and unloading test data occurs during the same clock cycle.

4. The method of claim 3, wherein the test data is loaded at a Serial In terminal, and the test data is unloaded at a Serial Out terminal.

5. The method of claim 4, wherein the Serial In terminal and Serial Out terminal comprise two pins on the electronic device.

6. The method of claim 4, wherein the Serial In and Serial Out terminal comprise the same pin on the electronic device.

7. The method of claim 3, wherein the acts of loading and unloading test data comprise a load/unload cycle.

8. The method of claim 7, wherein the act of performing an at speed test comprises a capture cycle.

9. The method of claim 8, wherein the output produced during the capture cycle is held in the scan-path until unloaded by the scan-wheel controller.

10. The method of claim 7, wherein the ratio between the clock speed of the electronic device being tested and the clock speed of the test equipment defines the number of rotations of the scan wheel required for the load/unload cycle.

11. The method of claim 10, wherein the ratio between the clock speed of the electronic device being tested and the clock speed of the test equipment defines the number of scan-path data bits shifted past the scan-wheel controller before test data is loaded and unloaded.

12. The method of claim 8, wherein the capture cycle occurs at each scan-flop simultaneously in response to a control signal from the scan-wheel controller that causes all scan-flops to apply the test data at the Serial In terminal.

13. The method of claim 12, wherein at least one of said scan-flops in said scan-wheel couples to any arbitrary sequential circuit, and said arbitrary sequential circuit calculates a response based on the test data at the Serial Out terminal of said at least one scan-flop.

14. The method of claim 13, wherein the response of said sequential circuit produces a signal that appears on the Serial In terminal of any of said scan-flops.

15. The method of claim 14, wherein the response of said sequential circuit to the test data fed to it during a clock cycle in which said control signal is generated is captured at the end of the clock cycle of the electronic device during which said control signal is generated.

16. The method of claim 1, wherein the number of scan-flops in the scan-wheel is an odd number.

17. The method of claim 16, wherein the scan-wheel controller includes a dummy scan-flop that is added to the scan-path to make the number of scan-flops in the scan-wheel an odd number.

18. The method of claim 17, wherein the ratio between the clock speed of the electronic device being tested and the clock speed of the test equipment is an integer of the form $2^n$ for $n \geq 0$.

19. The method as in claim 1, wherein said ratio and the number of scan-flops in said scan-wheel have different prime number factors.

20. A method of scan testing an electronic device with test equipment that operates at a slower clock speed than the electronic device, comprising the acts of:
   forming a scan wheel that includes a plurality of scan-flops in a closed scan-path;
   determining a ratio, SwRatio, between the clock speed of the electronic device being tested and the clock speed of the test equipment;
   loading a first test input bit to an input terminal of a scan-flop adjacent a scan-wheel controller;
   shifting the input test bit through a number of scan-flops equal to SwRatio on successive clock cycles of the electronic device;
   loading a second test input bit after the first test input bit has shifted through SwRatio number of scan-flops;
   continuing to load additional test input bits after each SwRatio number of shifts of the previously loaded test input bits, until each scan-flop in the scan-wheel has been loaded with test input bits; and
   capturing test results of an at speed test of each scan-flop once a test input bit has been loaded in each scan flop in the scan-wheel.

21. The method as in claim 20, wherein the SwRatio and the number of scan-flops in said scan-wheel have different prime number factors.

22. The method as in claim 21, wherein the number of scan-flops in said scan-wheel comprises an odd number.

23. The method as in claim 22, wherein the SwRatio=$2^n$, for an integer $n \geq 0$.

24. The method of claim 21, further comprising the act of unloading a test result bit each time a test input bit is loaded, and wherein the test data is loaded at a Serial In terminal, and the test result is unloaded at a Serial Out terminal.

25. The method of claim 20, wherein the SwRatio defines the number of rotations of the scan wheel required to load all scan-flops in the scan-wheel.

26. The method of claim 20, wherein the act of capturing test results occurs at each scan-flop simultaneously in response to a control signal from the scan-wheel controller that causes all scan-flops to input the loaded test data.

27. The method claim 26, wherein the control signal is the de-assertion of a shift signal.

28. The method of claim 26, wherein at least one of said scan-flops in said scan-wheel couple to a combinational circuit, and the combinational circuit calculates a response based on the loaded test data.

29. The method of claim 28, wherein the response of said combinational circuit produces a signal that appears as a test result.

30. The method of claim 29, wherein the response of said combinational circuit is latched as a test result at the end of the clock cycle of the electronic device in which said control signal is generated.

31. A system for testing an electronic device with test equipment that operates at a clock speed different than the clock speed of the electronic device, comprising:
   a scan-wheel including a plurality of scan-flops;
   a scan-wheel controller that selectively loads test data to one of said scan-flops in said scan-wheel by shifting said test data to said selected scan-flop during clock cycles of said electronic device; and
   wherein said scan-wheel controller only loads test data on clock cycles of said test equipment.

32. A system as in claim 31, wherein the scan-wheel controller captures test results after one set of test data is loaded on each scan-flop by transmitting a control signal to each scan-flop simultaneously.

33. A system as in claim 31, wherein the scan-wheel controller transmits a control signal to each scan-flop that causes said scan-flops to input the loaded test data.

34. A system as in claim 33, wherein each scan-flop generates a test result in response to inputting said test data.

35. A system as in claim 34, wherein at least one scan-flop couples to an arbitrary sequential circuit that receives the test data and produces a response, and said at least one scan-flop latches the response of said sequential circuit on the clock cycle of said electronic device subsequent to the inputting of said test data.

36. A system as in claim 31, wherein the number of said scan-flops in said scan-wheel is an odd number.

37. A system as in claim 36, wherein the ratio between the clock speed of the electronic device being tested and the clock speed of the test equipment determines the number of rotations that the scan-wheel must make before test data is loaded in each scan-flop.

38. A system as in claim 37, wherein the scan-wheel controller includes a data path and a control section.

39. A system as in claim 38, wherein the data path includes a Serial In terminal coupled to a scan-side multiplexer, and said 'scan-side multiplexer receives a shift control signal from said control section that causes a signal on said Serial In terminal to be loaded into the scan-path.

40. A system as in claim 39, wherein the data path further comprises a write multiplexer coupled between said Serial In terminal and said scan-side multiplexer, and wherein said write multiplexer periodically receives a control signal indicating it is time to replace the bit of scan-path data passing through.

41. The system as in claim 40, further comprising a scan-length parity flop that is enabled when required to make the total number of scan-flops an odd number.

42. The system as in claim 41, wherein the scan-length parity flop may be bypassed if the total number of scan-flops in the scan-wheel is an odd number.

43. The system as in claim 41, wherein the output of the scan-length parity flop couples to a sample point that is provided as an input to the write multiplexer.

44. The system as in claim 43, wherein the sample point is sampled by a sampler flop in response to said control signal indicating it is time to service the bit of scan-path data passing through.

45. The system as in claim 44, wherein said sampler flop generates an output signal that is passed by a pin-side multiplexer to a Serial Out terminal in response to said enable signal from said control section.

46. A system as in claim 38, wherein the control section includes a scan-wheel control register that includes a field for storing a value representing said ratio.

47. A system as in claim 46, wherein the control section further comprises a rotation counter that couples to said scan-wheel control register to receive a signal indicative of said ratio, and which produces an output signal when the scan wheel has rotated a number of times equal to the value in said field.

48. A system as in claim 47, wherein said control section further includes a scan test controller that generates a shift control signal that is transmitted to all scan-flops in said scan-wheel to cause said scan-flops to input said test data loaded by said scan-wheel controller.

49. A system as in claim 48, wherein said scan test controller includes a register that identifies the number of scan-flops in the scan-wheel.

50. A system as in claim 48, wherein said control section further comprises a clock divider that receives the value indicative of said ratio, and which generates a control signal indicating it is time to read or replace a bit of scan path data.

51. A system as in claim 31, wherein multiple parallel scan-wheels are provided to test the electronic device.

52. A system as in claim 51, wherein each multiple parallel scan-wheel simultaneously loads a different test bit to said electronic device.

53. The method as in claim 1, further comprising the act of unloading test data from each scan-flop for debugging or diagnosis.

* * * * *